US006303464B1

(12) United States Patent
Gaw et al.

(10) Patent No.: US 6,303,464 B1
(45) Date of Patent: Oct. 16, 2001

(54) METHOD AND STRUCTURE FOR REDUCING INTERCONNECT SYSTEM CAPACITANCE THROUGH ENCLOSED VOIDS IN A DIELECTRIC LAYER

(75) Inventors: Eng T. Gaw, San Jose; Quat T. Vu, Santa Clara; David B. Fraser, Danville; Chien Chiang, Fremont, all of CA (US); Ian A. Young, Portland, OR (US); Thomas N. D. Marieb, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 08/774,382

(22) Filed: Dec. 30, 1996

(51) Int. Cl.$^7$ .................................................. H01L 21/76
(52) U.S. Cl. .................... 438/422; 438/411; 438/421; 438/619; 438/631; 438/778; 257/758
(58) Field of Search .................................... 438/421, 422, 438/411, FOR 225, 778, 619, 631; 257/758

(56) References Cited

U.S. PATENT DOCUMENTS

| | | |
|---|---|---|
| 4,599,790 | 7/1986 | Kim et al. . |
| 5,001,079 | 3/1991 | Van Laarhoven et al. . |
| 5,217,926 | 6/1993 | Langley . |
| 5,310,700 | 5/1994 | Lien et al. . |
| 5,324,683 | 6/1994 | Fitch et al. ................................ 437/65 |
| 5,338,975 | 8/1994 | Cole, Jr. et al. . |
| 5,407,860 | 4/1995 | Stoltz et al. . |
| 5,488,015 | 1/1996 | Havemann et al. . |
| 5,512,775 | 4/1996 | Cho . |
| 5,621,241 | 4/1997 | Jain . |
| 5,641,712 | 6/1997 | Grivna et al. . |
| 5,691,573 | * 11/1997 | Avanzino et al. .................... 257/758 |
| 5,719,084 | 2/1998 | Mallon et al. . |
| 5,728,631 | * 3/1998 | Wang .................................... 438/787 |
| 5,759,913 | * 6/1998 | Fulford, Jr. et al. .................. 438/624 |
| 5,776,834 | * 7/1998 | Avanzino et al. ..................... 438/692 |
| 5,837,618 | * 11/1998 | Avanzino et al. ..................... 438/778 |
| 5,955,786 | * 9/1999 | Avanzino et al. ..................... 257/758 |
| 5,990,557 | * 11/1999 | Avanzino et al. ..................... 257/758 |
| 6,048,802 | * 4/2000 | Avanzino et al. ..................... 438/763 |
| 6,077,767 | * 6/2000 | Hwang ................................ 438/619 |

FOREIGN PATENT DOCUMENTS 63-98134 * 4/1998 (JP) ............................. 438/FOR 255

OTHER PUBLICATIONS

S. Wolf, "Silicon Processing for the VLSI Era", vol. 2, Lattice Press, pp. 194–199, 1990.*
IBM Technical Disclosure Bulletin, *Reduced Capacitance Interconnect System Using Decomposition of Air Gap Filler Material*, Sep. 1995, vol. 38, No. 9, pp. 137–140.

* cited by examiner

Primary Examiner—Eddie Lee
Assistant Examiner—José R Díaz
(74) Attorney, Agent, or Firm—Cynthia T. Faatz

(57) ABSTRACT

A reduced capacitance interconnect system. A first metal layer is formed to a predetermined level above a first dielectric layer which is formed on a semiconductor substrate. The first metal layer level forms multiple interconnect lines wherein each interconnect line is separated from each adjacent interconnect line by a trench including a trench having a highest aspect ratio. A second dielectric layer is formed on the first metal layer and in the trenches between the interconnect lines such that an enclosed void having a void tip substantially level with the top of the metal layer is formed in at least each trench having an aspect ratio above a predetermined minimum aspect ratio, wherein the enclosed void in the trench having the highest aspect ratio has a void volume which is at least 15% of the volume of the trench.

8 Claims, 2 Drawing Sheets

METHOD AND STRUCTURE FOR REDUCING INTERCONNECT SYSTEM CAPACITANCE THROUGH ENCLOSED VOIDS IN A DIELECTRIC LAYER

BACKGROUND OF THE INVENTION

1. Field of the Invention

The present invention relates to the field of semiconductor integrated circuit devices, and in particular, to the design of reduced capacitance interconnection systems for semiconductor integrated circuit devices.

2. Description of Related Art

Interconnect system design for modern integrated circuit devices, especially for microprocessors, involves many considerations to minimize noise, ensure proper signal timing and switching, and to optimize performance. This is especially true as interconnect density increases and the interconnect system becomes a performance limiting factor. The trend towards smaller, lower power devices, for example, requires interconnect system capacitance to be reduced as much as possible in order to minimize effects such as resistor/capacitor (RC) delay and cross-talk on signals transmitted by the interconnect system, which may be exacerbated by the reduced spacing between interconnect lines.

The capacitance of an interconnect system is essentially equivalent to the cumulative total of the capacitance experienced by each interconnect line in the interconnect system. The capacitance experienced by a particular interconnect line, referred to herein as the line capacitance, includes both line-to-line capacitance components (between adjacent lines on a same metal layer) and line-to-next metal layer components (between an interconnect line and metal layer(s) above and/or below the interconnect line).

Neither the surface area of the interconnect lines nor the spacing between interconnect lines or metal layers can be easily changed without affecting other critical parameters such as the packing density of the integrated circuit or the resistance of the interconnect lines. Thus, the focus in reducing the capacitance of interconnect systems is on reducing the effective dielectric constant of the material between the interconnect lines to a value below that of $SiO_2$, one of the most commonly used interlevel dielectric (ILD) materials.

There are many requirements for an ILD material to be viable for use in modern integrated circuit chips. Mechanical strength and stability, long term reliability, ability to withstand semiconductor processing conditions and cost considerations are key among these factors. Many materials having low dielectric constants have been evaluated and found to be unacceptable for use as ILD materials based on one or more of the above criteria. For example, some organic polymers which have dielectric constants lower than the dielectric constant of $SiO_2$ are mechanically weak and may not be able to withstand the high temperatures and mechanical stresses to which the interconnect system is subjected during processing and prolonged use. Further, many materials with lower dielectric constants do not have the heat conduction properties of $SiO_2$ which are important for higher density integrated circuits.

Different processing approaches, such as the creation of "air bridges" have also been used in an attempt to reduce the effective dielectric constant of the material between interconnect lines. One approach to forming air bridges is described in U.S. Pat. No. 5,324,683 to Fitch et al. In Fitch, air regions are formed by selectively removing either a sacrificial spacer or a sacrificial layer. While air has a much lower dielectric constant than $SiO_2$, the air bridge approach requires additional processing steps and, because the air bridges typically include a relatively large area of material unsupported by an underlying structure, may lack the mechanical strength required for a sufficiently robust interconnect system for modern integrated circuits.

Thus, what is needed is a lower capacitance interconnect system which is mechanically strong and stable, is not vulnerable to particular steps in the semiconductor fabrication process, and is cost-effective to implement.

SUMMARY OF THE INVENTION

The invention provides a reduced capacitance interconnect system for use in integrated circuits. The interconnect system of the invention is formed on an integrated circuit including a semiconductor substrate and a first dielectric layer formed on the semiconductor substrate. A first metal layer including multiple interconnect lines is formed on the first dielectric layer to a predetermined level above the first dielectric layer. Each of the multiple interconnect lines is separated from each adjacent interconnect line by a trench including a trench having a highest aspect ratio. A second dielectric layer is formed on the first metal interconnect layer and in the trenches between interconnect lines such that an enclosed void having a void tip substantially level with the top of the metal layer is formed in at least each trench having an aspect ratio above a predetermined minimum aspect ratio, wherein the enclosed void in the trench having the highest aspect ratio has a void volume which is at least 15% of the volume of the trench.

BRIEF DESCRIPTION OF THE DRAWINGS

The invention will be understood more fully from the detailed description given below and from the accompanying drawings of embodiments of the invention, which, however, should not be taken to limit the invention to the specific embodiments, but are for explanation and understanding only.

DETAILED DESCRIPTION OF THE INVENTION

A technique and structure for reducing interconnect system capacitance is described. In the following description, numerous specific details are set forth such as specific materials, dimensions, types of deposition and etch processes, etc. in order to provide a thorough understanding of the invention. However, it will be appreciated by those skilled in the art that the invention may be practiced without these specific details. In other instances, wellknown structures, materials and techniques have not been described in detail in order to avoid obscuring the invention.

Overview of the Invention

The present invention reduces the capacitance of an interconnect system through a structure and process which provides enclosed voids in trenches between interconnect lines of the interconnect system for at least the trenches having an aspect ratio above a minimum aspect ratio at which enclosed voids are formed, wherein the enclosed voids in trenches having the highest aspect ratio have a volume which is at least 15% of the volume of the trenches. Each of the enclosed voids of the invention has a void tip which is substantially level with the top surface of the surrounding interconnect lines regardless of the aspect ratio of the trench. The term "aspect ratio" of a trench as used herein refers to the ratio of the thickness of the metal layer forming the interconnect lines surrounding a trench to the width of the trench.

The enclosed voids of the invention cause the dielectric medium in trenches including enclosed voids to be a mixture of air (vacuum) and the deposited dielectric material. For any dielectric material having a dielectric constant above b 1(the dielectric constant for air), the present invention operates to reduce the effective dielectric constant for the line-to-line component of the line capacitance of each interconnect line, and thus, reduces the capacitance of the overall interconnect system. Further, by controlling the void tips to be substantially level with the metal layer, the enclosed voids are large in order to effect a significant reduction in the effective dielectric constant while also ensuring that the enclosed voids are not inadvertently opened up during a subsequent etch or chemical-mechanical polishing step. The invention is described in detail below.

Interconnect System of the Invention

Figure 1:
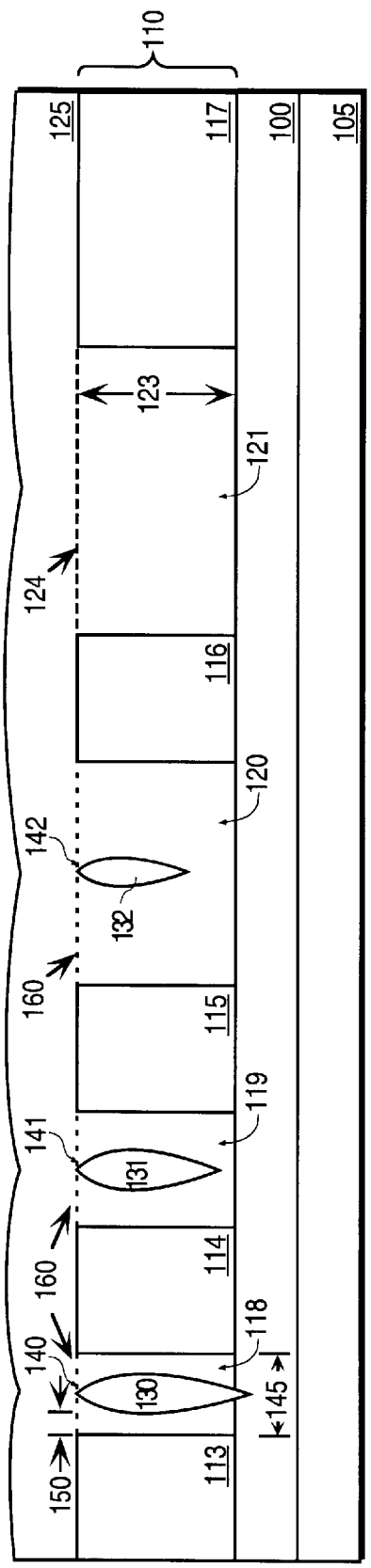
FIG. 1 illustrates a cross-section of an integrated circuit having an interconnect system in accordance with one embodiment of the invention.

One embodiment of the interconnect system of the invention is described in reference to FIG. 1. FIG. 1 illustrates a cross-section of a portion of an integrated circuit having an interconnect system in accordance with one embodiment of the present invention. The integrated circuit of FIG. 1 has a first insulating interlevel dielectric (ILD) layer 100 formed on a substrate 105. The substrate 105 is a silicon wafer or die in one embodiment, however other types of substrates including other types of semiconductor substrates are also within the scope of the invention. The substrate 105 may include, for example, device regions such as diffused junctions, other structures such as gates, local interconnections, metal layers, or other device structures or layers. The first dielectric layer 100 is formed Of $SiO_2$ in one embodiment but may also be formed of one or more layers of silicon nitride, silicon oxynitride, fluorinated silicon dioxide (SiOF) or another dielectric material. The thickness, deposition method and material of the ILD layer 100 is not critical as long as the ILD layer 100 provides the needed electrical isolation between overlying metal layers and any conductive layers in the substrate 105.

A first metal interconnect layer 110 including multiple interconnect lines such as the interconnect lines 113–117, is formed on the first interlevel dielectric layer 100 to a predetermined thickness 123 above the first dielectric layer 100. The dotted line 124 indicates the level of the top surface of the first metal layer 110. Note that the first metal interconnect layer 110 may include multiple layers of metal forming a stack. The metal interconnect lines are provided to interconnect active and passive devices on the integrated circuit and may be connected to interconnect lines on other metal layers by vias (not shown).

The metal interconnect layer 110 is formed of sputter-deposited aluminum in one embodiment, but may be formed using another metal layer formation process or a different conductive material such as an aluminum alloy, tungsten, copper, or one or more other similar materials. The choice of materials may depend on considerations such as processing temperatures or the conditions to which the integrated circuit device will be subjected during use.

Each of the interconnect lines 113–117 is separated from each adjacent interconnect line by one of the trenches 118–121. For example, the interconnect line 116 is separated from a first adjacent interconnect line 115 by the trench 120 and from a second adjacent interconnect line 117 by the trench 121. The trenches 118–121 range in aspect ratio from a highest aspect ratio, shown as trench 118, to a lowest aspect ratio, shown as the trench 121.

A second dielectric layer 125 is formed on the metal layer 110 and in the trenches 118-121 between the interconnect lines 113–117 such that an enclosed void is formed in at least each of the trenches on the metal layer 110 which has an aspect ratio above a predetermined minimum aspect ratio at which enclosed voids are formed in accordance with the invention. The second dielectric layer 125 is formed of $SiO_2$ in one embodiment but may also be formed of other dielectric materials such as fluorinated silicon dioxide (SiOF), silicon nitride, silicon oxynitride or low dielectric constant polymers, for example.

In the example illustrated in FIG. 1, an enclosed void 130 is formed in the trench 118, an enclosed void 131 is formed in the trench 119, and an enclosed void 132 is formed in the trench 120. The trench 121 is completely filled with the second layer dielectric material as the trench 121 has an aspect ratio below the predetermined minimum aspect ratio at which enclosed voids are formed in one embodiment. The minimum aspect ratio is discussed in more detail below.

In accordance with the invention, each of the enclosed voids 130–132 has a void tip 140–142 respectively which is substantially level with the level 124 of the top surface of the metal layer indicated also by the dotted lines 160, or more precisely, the top surface of the surrounding interconnect lines. "Substantially level" in this context means the distance from a particular void tip such as the void tip 140 to the level 124 of the top surface of the interconnect lines 113 and 114, if the void tip 140 is either above or below the level of the interconnect lines, is no greater than 10% of the thickness 123 of the metal layer 110.

Further, in accordance with the invention, the enclosed void 130 in the highest aspect ratio trench 118 (which has an aspect ratio above the minimum aspect ratio at which enclosed voids are formed for the particular process), has a volume which is at least 15% of the volume of the trench 118. The volume of the trench 118 is defined as the height 123 of the trench times the width 145 of the trench, the cross-section of the trench being substantially uniform over its length (into FIG. 1). It will be appreciated by those of skill in the art that on a typical integrated circuit, there may be several trenches which have an aspect ratio equal to the highest trench aspect ratio on the integrated circuit die. In this case, each of the enclosed voids in each of the trenches having the highest aspect ratio has a volume which is at least 15% of the volume of the trench in which it is formed.

In contrast to prior integrated circuits for which a goal has been to fill trenches between interconnect lines as much as possible, in accordance with the present invention, it is desirable to have enclosed voids in trenches and to have the volume of the enclosed voids as large as possible within other constraints of the structure. Large voids in accordance with the invention are desirable because they reduce the effective dielectric constant of the second dielectric layer 125 in the manner described below, and thus reduce the overall interconnect system capacitance. The larger the enclosed voids of the invention are, the greater the reduction in capacitance.

One constraint on the void size is presented by the need to control electromigration of the metal forming the interconnect lines 113–117. In order to ensure that electromigration is maintained within an acceptable range for long term reliability, in accordance with one embodiment of the invention, the thickness of the second dielectric layer 125 on the trench sidewalls is above a predetermined minimum thickness. In an integrated circuit using the invention, this predetermined minimum thickness for the second dielectric layer 125 on the trench sidewalls would be less than or equal to the thinnest point 150 at the sidewall of the highest aspect ratio trench 118 having the largest enclosed void 130. In one embodiment in which the second dielectric layer is formed of $SiO_2$, for trenches having widths smaller than one micron, this minimum sidewall thickness is approximately 20% of the trench width 145. For trenches having widths of one micron and larger, the minimum sidewall thickness is 0.20 microns and up. The minimum sidewall thickness may be different for different materials.

The positioning of the enclosed void tips is another constraint on the void size. As described above, a tip of each of the enclosed voids is substantially level with the metal layer 110. The positioning of the void tips 140–142 in this manner ensures that the enclosed voids 130–132 will not be opened up during subsequent chemical mechanical polishing or other processing steps following formation of the second dielectric layer 125. Further, positioning of the enclosed void tips 140–142 to be substantially level with the metal layer level 124 allows for the enclosed voids 130–132 to be large, extending through as much of the trench as possible in high aspect ratio trenches such as the trench 118 while maintaining a thinnest sidewall thickness point 150 at least equal to the required minimum sidewall thickness. In some cases, such as with the enclosed void 140 in the highest aspect ratio trench 118, the enclosed voids may actually extend down into the first dielectric material layer 100 to further increase the size of the voids while maintaining high reliability.

The shape of the enclosed voids 130–132 as shown in FIG. 1 is elongated and approaches an elliptical shape in accordance with one embodiment. The elongated and somewhat elliptical shape is advantageous in that the volume of the voids can be very large while maintaining high reliability. Further, as the enclosed voids 130–132 do not include sharp corners (other than the void tips 140–142) the potential for cracking of the second dielectric layer 125 is reduced.

The minimum trench aspect ratio above which enclosed voids are formed in the trenches 118–121 is determined by several factors including the type of process, particular process parameters, and material used to form the second dielectric layer 125 and thus may vary from process to process. In accordance with one embodiment of the invention in which the second dielectric layer 125 is formed of $SiO_2$ and which is described in more detail below, the predetermined minimum aspect ratio above which enclosed voids are formed is about 1.0. For example, an enclosed void is not formed in the trench 121 during deposition of the second dielectric layer 125 as the aspect ratio of the trench 121 is below the predetermined minimum aspect ratio.

The dielectric material which surrounds the enclosed voids 130–132 helps the interconnect system structure to maintain mechanical strength and prevents electromigration as described above. Further, because $SiO_2$ and other known and proven dielectric materials can be used to form the dielectric material of the dielectric layer 125 including the enclosed voids, incremental processing costs are kept low. Also, in the case of $SiO_2$, advantages such as its heat conduction properties, are maintained while providing the resultant reduction in capacitance.

Additional layers such as additional interlevel dielectric and metal layers and/or passivation layers may be formed on top of the second dielectric layer 125. Further, the metal layer 110 may be a first level metal layer (a metal layer closest to the substrate) or may be a higher level metal layer in a multi-level interconnect structure with some or all of the interconnect layers being formed in accordance with the present invention.

Capacitance Reduction in Accordance with the Invention

The enclosed voids of the invention act to reduce the effective dielectric constant of the material between the interconnect lines of a particular metal layer or layers on an integrated circuit. In this manner, the line-to-line capacitance is reduced for each interconnect line in the particular metal layer (or at least for those interconnect lines adjacent to one or more trenches above a certain minimum aspect ratio) thereby reducing the overall interconnect system capacitance.

As described above, the enclosed voids of the invention are formed in the trenches which separate adjacent interconnect lines on a same metal layer. Thus, the reduction in capacitance of an interconnect system in accordance with the invention is in the form of reduced line-to-line or crosstalk capacitance for each interconnect line which is separated from one or more adjacent interconnect lines by a trench including an enclosed void in accordance with the invention.

The amount by which the line-to-line capacitance of two interconnect lines is reduced in accordance with the invention can be conservatively estimated using the relative volume of the enclosed void in the trench separating the two interconnect lines. As is well known, capacitance is directly proportional to the dielectric constant of the dielectric material in a capacitor. If the volume of an enclosed void is 30% of the trench volume, for example, then the effective dielectric constant of the material between the interconnect lines can be roughly determined by multiplying the relative volume of the void in the trench (0.3 in this example) times the dielectric constant of the void ($k_{air}=1$) and adding to it the relative volume of the dielectric material in the trench ($(1-0.3)$ or 0.7) times the dielectric constant of the dielectric material ($k_{SiO2}=4$). Thus:

$$k_{eff} = (0.3 \times 1) + (0.7 \times 4) = 3.1$$

The effective dielectric constant 3.1 is about 23% lower than the effective dielectric constant of $SiO_2$, thus, the line-to-line capacitance of the interconnect lines is reduced by at least 23%.

Thus, in order to reduce the line-to-line capacitance between two particular interconnect lines by at least a given amount X, an enclosed void having a volume Y of at least $Y=4X/3$ is formed in the trench between the two interconnect lines where the dielectric material used is $SiO_2$ or another dielectric material having a dielectric constant of about 4. This relationship is derived using the conservative model above and the following equations:

$$(k_{sio2} - k_{eff})k_{sio2} = X \text{ (the amt. by which line-line cap. is reduced)} \quad (1)$$

$$k_{eff} = (Y*1) + (1-Y)k_{Sio2} = Y + (1-Y) \; 4 = 4-3Y \quad (2)$$

therefore $X=4-(4-3Y)/4$ and $Y=4X/3$ (3)

Using a particular example, if it is desired to reduce the line-to-line capacitance between two interconnect lines by 30%, then an enclosed having a volume of $Y=(4*0.3)/3=0.4$ or $(0.4*100)=40\%$ of the trench volume is formed in accordance with the invention. It will be appreciated by those of skill in the art that a similar relationship can be determined for other dielectric materials having different dielectric constants by using their dielectric constants in place of $k_{SiO2}$ above.

The amount by which the overall interconnect system capacitance is reduced depends on the cumulative reduction in line-to-line capacitance determined as described above, as well as the percentage of the overall capacitance which is contributed by the line-to-line capacitance versus the line-to-next metal layer capacitance (capacitance between an interconnect line and metal layers above and/or below the metal layer of interest).

Since voids are left only between lines, the aspect ratio of the trenches separating interconnect lines has a strong impact on the amount by which the present invention reduces the overall line capacitance for a particular interconnect line. For the same spacing between metal layers, for increasing trench aspect ratios, the line-to-line capacitance is a larger and larger component of the overall line capacitance. Because the line-to-line capacitance is an increasingly large percentage of the line capacitance as the aspect ratios of trenches surrounding an interconnect line increase, the overall equivalent dielectric constant will be lower for enclosed voids which occupy the same percentage of trench volume where the trenches have higher aspect ratios.

For example, using the conservative mixed dielectric model, to reach an overall equivalent dielectric constant of 3.6 (a 10% reduction from $SiO_2$), the enclosed voids in trenches surrounding the interconnect lines must occupy about 30% of the volume of each trench where the aspect ratio of the trenches is 1. However, where the aspect ratio of the trenches is 2, the void need only occupy about 25% of the trench volume where other factors such as spacing between metal layers remain the same.

Thus, the invention provides a particular advantage for interconnect systems which include trenches having high aspect ratios. Because the interconnect lines which are separated by trenches having high aspect ratios are the interconnect lines having the largest line capacitance, the invention provides a reduction in capacitance where it is most needed.

The Method of One Embodiment of the Invention

Figure 2:
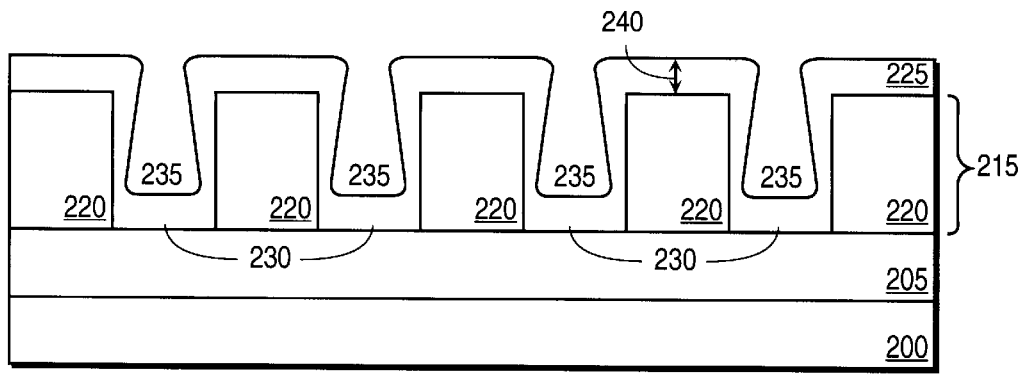
FIG. 2 illustrates a cross-section of an integrated circuit having an interconnect system in accordance with one embodiment of the invention following a first dielectric layer deposition step.
Figure 3:
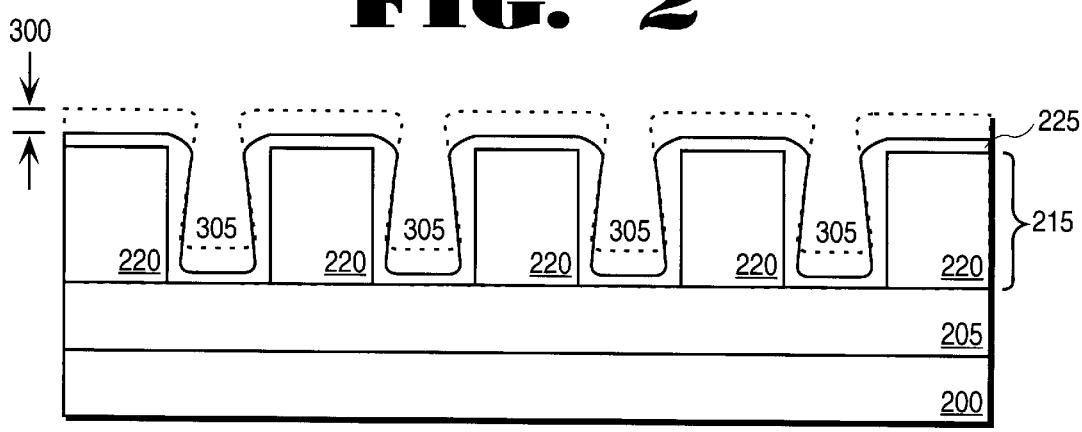
FIG. 3 illustrates a cross-section of an integrated circuit having an interconnect system in accordance with one embodiment of the invention following a first dielectric layer etch step.
Figure 4:
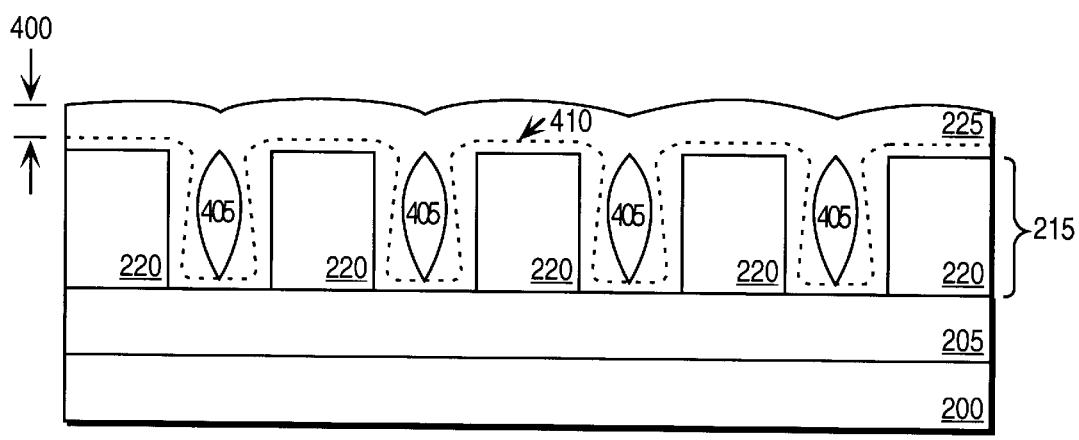
FIG. 4 illustrates a cross-section of an integrated circuit having an interconnect system in accordance with one embodiment of the invention following a second dielectric layer deposition step.

The method of one embodiment of the invention is described in reference to FIGS. 2–4 in which like reference numbers refer to similar structures and/or materials. Referring first to FIG. 2, a cross-section of an integrated circuit formed on a substrate 200 such as a semiconductor wafer is shown. A first interlevel dielectric layer 205 is formed on the substrate 200 and a first metal layer 215 including multiple interconnect lines 220 is formed on the first dielectric layer 205. Following formation of the metal interconnect layer 215, a second interlevel dielectric layer 225 is deposited on the metal layer 215 and in the trenches 230 between the interconnect lines 220 such that voids 235 are formed in the trenches 230 between the interconnect lines 220.

In one embodiment, the second dielectric layer 225 is formed of $SiO_2$ which is deposited on the metal interconnect layer 215 in the initial deposition step to a predetermined thickness 240 of 2000 Å using a plasma tetraethyl orthosilicate (PTEOS) deposition process for a minimum trench width of 0.4 um and trench height of 0.8 um. This non-conformal PTEOS deposition process can be performed using an AMAT 5000 PTEOS system from Applied Materials or another parallel plate, capacitively coupled plasma system with similar features, for example. The particular chemical vapor deposition process used to deposit the second dielectric layer 225 is a highly non-conformal process such that the voids 235 are large, having a volume equal to at least 15% of the trench volume for the highest aspect ratio trenches in the interconnect system, which in one embodiment have an aspect ratio of about 2. Depending on the particular process used, the voids 235 are more or less open to the ambient.

The non-conformal nature of the process is indicated by the sticking coefficient of the process $S_c$, which in one embodiment is 0.26 or greater. The highly non-conformal nature of the process used to deposit the second dielectric material layer 225 is in sharp contrast to the approaches used today for interlevel dielectric material layer deposition. In general, current ILD deposition processes are targeted to be as conformal as possible in order to substantially or completely fill the trenches between interconnect lines on an integrated circuit. In order to achieve a highly non-conformal process to maximize the size of the voids in the trench volumes provided, it is desirable for the dielectric material deposition process to have a low angular flux, and a low saturation constant and for the process to be performed at a low temperature and low partial pressure.

Referring now to FIG. 3, following the initial deposition step of the second dielectric layer material, the dielectric material layer 225 is sputter-etched to remove a predetermined thickness 300 which in one embodiment is about 600 Å. The portion of the second dielectric layer 225 which is removed through the etching step is indicated by the dotted lines in FIG. 3. The etching process opens further voids which are partially open to the ambient following the initial dielectric layer deposition step. In this manner, open voids such as the voids 305 are formed in the trenches 230 between the interconnect lines 220. In one embodiment, the sputter-etching step illustrated in FIG. 3 is performed using an Argon sputter etch process which may also be performed using the AMAT 5000 PTEOS system from Applied Materials which includes in situ sputter etch capabilities. Further, in one embodiment, the etching step etches down into the underlying first dielectric layer 205 such that the enclosed void extends into the underlying dielectric layer and is made even larger. An example of a void formed using such an etching step may be similar to the enclosed void 130 in FIG. 1.

Following the etch step illustrated in FIG. 3, a second deposition step is performed. Referring to FIG. 4, in the second deposition step, the same dielectric material that was deposited in the initial deposition step is deposited to a predetermined thickness 400 in order to complete the formation of the second dielectric material layer 225. The dotted line 410 indicates the level and shape of the dielectric layer 225 prior to the second deposition step. The second dielectric material deposition step is performed such that enclosed voids 405 which have void tips substantially level with the top surface of the metal layer 215 are formed in each of the trenches 230 at least for trenches having an aspect ratio above a predetermined minimum aspect ratio and such that the enclosed void in the trench(es) having the highest aspect ratio, about 2 in one embodiment, have a relative volume of at least 15% of the trench volume. Further, the corners of the voids 305 are rounded in the step shown in FIG. 4 to protect against cracking of the second dielectric layer and to ensure that the minimum sidewall thickness discussed above in reference to FIG. 1 is maintained. In one embodiment, the second dielectric material deposition step is also performed using a PTEOS process and the thickness 400 is about 18,000 Å.

Although particular processes and thicknesses as described above in the context of a specific embodiment, other types of processes and other material thicknesses are also within the scope of the invention. For example, although the embodiment described above uses PTEOS deposition processes to specific thicknesses, other dielectric material deposition processes which are either inherently non-conformal or can be adjusted to be non-conformal such as silane chemistry low pressure chemical vapor deposition (LPCVD) or plasma-enhanced chemical vapor deposition (PECVD) processes may be used in alternate embodiments. Also, the thickness of either deposition layer may be either higher or lower than the thickness in the embodiment described above depending on the particular process used and the desired size of the resultant enclosed voids.

Also, in alternate embodiments, other types of etch processes may also be used and the thickness 300 of the material removed from the second dielectric layer 225 by the etch process may be higher or lower than 600 Å for a different process, or in order to adjust the size or location of the resulting enclosed voids. Further, in alternate embodiments, multiple alternate deposition and etch steps may be used in order to further control the void tip location and the size of the enclosed voids.

The method of the invention provides for control of the location of the tip of enclosed voids within the trenches while also forming a large enough void that interconnect system capacitance is significantly reduced. Controlling the location of the void tip ensures that the enclosed voids in trenches between interconnect lines are large, but also that they are not opened up during subsequent etch or chemical mechanical polishing steps and that they are not left partially open to the ambient such that foreign material enters the void. Further, this process can be used for interconnect systems including trenches having a wide range of aspect ratios to form enclosed voids above a predetermined minimum aspect ratio, even where the aspect ratios have a wide range on a single integrated circuit chip.

Thus, the present invention provides a technique and structure for reducing interconnect system capacitance which is mechanically strong, involves little additional process cost and for which it is possible to utilize known materials. The interconnect system of the invention provides several advantages over traditional approaches to interconnect system formation as well as over other approaches focused on reducing the effective dielectric constant. By forming enclosed voids in at least trenches having aspect ratios above a predetermined minimum aspect ratio, the interconnect system designer has the flexibility to target formation of the enclosed voids to achieve a significant reduction in interconnect system capacitance for a range of different processing technologies and interconnect system designs.

The enclosed voids or air gaps of the present invention provide the additional advantage of reducing the variability of the interconnect system capacitance across the integrated circuit chip even where the aspect ratios of the trenches formed between the interconnect lines of the interconnect system varies.

Whereas many alterations and modifications of the invention may occur to one of ordinary skill in the art after having read the foregoing description, it is to be understood that the particular embodiments shown and described by way of illustration are in no way intended to be considered limiting. Therefore, references to details of various embodiments are not intended to limit the scope of the claims which themselves recite only those features regarded as essential to the invention.

We claim:

1. A method for forming a reduced capacitance interconnect system on a substrate, the method comprising:

forming a first metal interconnect layer including a first set of interconnect lines on the substrate, each of the interconnect lines being separated from an adjacent interconnect line by a trench, the trenches ranging in aspect ratio to a highest aspect ratio, the first metal layer being formed to a predetermined level above the substrate; and alternately depositing and etching a dielectric layer on the first metal interconnect layer such that enclosed voids are formed in at least each of the trenches having an aspect ratio above a predetermined minimum aspect ratio, each of the enclosed voids having a void tip substantially level with the top of the metal layer, the enclosed voids in each of the trenches having the highest aspect ratio having a volume that is 15% or more of a volume of the corresponding trench.

2. The method as set forth in claim 1 wherein alternately depositing and etching the dielectric layer includes alternately depositing and etching $SiO_2$.

3. The method as set forth in claim 1 wherein alternately depositing and etching the dielectric layer includes using a PTEOS process.

4. The method as set forth in claim 1 wherein etching includes using a sputter-etch process.

5. The method as set forth in claim 1 wherein alternately depositing and etching includes using a PTEOS machine having in situ sputter-etch capabilities.

6. The method as set forth in claim 1 wherein the predetermined minimum aspect ratio is about 1.

7. A method for reducing the line-to-line capacitance between two metal lines in an interconnect system, the method comprising:

determining a coefficient X by which to reduce the capacitance between the two metal lines; and alternately depositing and etching a dielectric material having a dielectric constant of about 4 on the metal lines and in a trench between the two metal lines to form an enclosed void in the trench having a volume equal to at least (4X/3) times the trench volume, the enclosed void having a void tip that is substantially level with the top surface of the metal lines.

8. The method as set forth in claim 7 wherein X is equal to 0.3 and the volume of the enclosed void is 0.4 times the trench volume.

* * * * *